US005886908A

United States Patent [19]
Conn et al.

[11] Patent Number: 5,886,908
[45] Date of Patent: Mar. 23, 1999

[54] METHOD OF EFFICIENT GRADIENT COMPUTATION

[75] Inventors: Andrew Roger Conn, Mount Vernon; Rudolf Adriaan Haring, Manor; Chandramouli Visweswariah, Croton-on-Hudson, all of N.Y.

[73] Assignee: International Business Machines Corporation, Armonk, N.Y.

[21] Appl. No.: 825,278

[22] Filed: Mar. 27, 1997

[51] Int. Cl.$^6$ ............................. G06F 9/455; G06F 17/50
[52] U.S. Cl. ............................................ 364/578; 364/490
[58] Field of Search ................................... 364/578, 488, 364/489, 490, 491

[56] References Cited

U.S. PATENT DOCUMENTS

| | | | |
|---|---|---|---|
| 5,257,200 | 10/1993 | Machala et al. | 364/578 |
| 5,329,478 | 7/1994 | Kirk et al. | 364/828 |
| 5,369,594 | 11/1994 | Huang et al. | 364/489 |
| 5,381,361 | 1/1995 | Kirk et al. | 364/807 |
| 5,424,964 | 6/1995 | Machala et al. | 364/578 |
| 5,506,852 | 4/1996 | Chakradhar et al. | 364/489 |
| 5,682,322 | 10/1997 | Boyle et al. | 364/491 |

OTHER PUBLICATIONS

*The Generalized Adjoint Network and Network Sensitivities*, Director et al., IEEE Transactions on Circuit Theory, pp. 318–323, vol. CT–16, No. 3, Aug. 1969.
*Transient Sensitivity Computation for MOSFET Circuits*, Hocevar et al., IEEE Transactions on Computer–Aided Design of Integrated Circuits and Systems, pp. 609–620, vol. CAD–4, Oct. 1985.
*Multiplier and Gradient Methods*, Hestenes, Journal of Optimization Theory and Applications, pp. 303–320, vol. 4, 1969.
*A Method for Nonlinear Constraints in Minimization Problems*, M.J.D. Powell, Optimization, R. Fletcher, editor, Academic Press, London and New York, 1969.
*Piecewise Approximate Circuit Simulation*, Visweswariah et al., IEEE Transactions on Computer–Aided Design of Integrated Circuits and Systems, pp. 861–870, vol. CAD–10, Jul. 1991.
*SPICE2: A Computer Program to Simulate Semicondutor Circuits*, L.W. Nagel, Memo UCB/ERL M520, University of California, Berkeley, May 1975.

*Primary Examiner*—Kevin J. Teska
*Assistant Examiner*—Russell W. Frejd

[57] ABSTRACT

A method of efficient computation of gradients of a merit function of a system includes the steps of: specifying at least one parameter for which the gradients with respect to the at least one parameter are desired; specifying the merit function of interest in terms of observable measurements of the system; either solving or simulating the system to determine values of the measurements; expressing the gradients of the merit function as the gradient of a weighted sum of measurements; forming an appropriately configured adjoint system; and either solving or simulating the adjoint system to simultaneously determine the gradients of the merit function with respect to the at least one parameter by employing a single adjoint analysis. Preferably, the system may be modeled by a set of equations comprising at least one of the following: a nonlinear set of equations, a linear set of equations, a set of linear partial differential equations, a set of nonlinear partial differential equations, a set of linear differential algebraic equations or a set of nonlinear differential algebraic equations. Further, the system of interest may be a network and, preferably, may be an electrical circuit. Still further, elements of the adjoint network and excitations of the adjoint network are determined in order to obtain the gradients of the merit function by employing a single adjoint analysis. It is to be appreciated that, in a preferred embodiment, the gradients of merit function are computed for the purpose of optimization and the merit function may be either a Lagrangian merit function or an augmented Lagrangian merit function.

20 Claims, 2 Drawing Sheets

METHOD OF EFFICIENT GRADIENT COMPUTATION

BACKGROUND OF THE INVENTION

This invention relates to methods of performing gradient computation and, more particularly, to gradient-based methods of performing circuit optimization.

Rapid and automatic optimization (or tuning) of circuits is crucial to high-performance circuit design. Circuit tuning is a nonlinear optimization problem which is best solved by gradient-based methods. The adjoint method, as disclosed in the article by S. W. Director et al., "The Generalized Adjoint Network and Network Sensitivities," IEEE Transactions on Circuit Theory, pp. 318–323, vol. CT-16, no. 3 (August 1969), permits the computation of the gradients of one measurement of the circuit with respect to any number of design parameters by means of a single adjoint analysis. However, the adjoint analysis must be repeated for each measurement of interest. Likewise, the direct method of gradient computation, as disclosed in the article by D. A. Hocevar et al., "Transient Sensitivity Computation for MOSFET Circuits," IEEE Transactions on Computer-Aided Design of Integrated Circuits and Systems, pp. 609–620, vol. CAD-4 (October 1985), can compute the gradient of all measurements with respect to one design parameter and, therefore, must be repeated for each design parameter. As a result, the gradient computation procedure is often the bottleneck in circuit optimization programs.

SUMMARY OF THE INVENTION

In one aspect of the present invention, a method of efficient computation of gradients of a merit function of a system includes the steps of: specifying at least one parameter (but, preferably, many parameters may be specified) for which the gradients with respect to the at least one parameter are desired; specifying the merit function of interest in terms of observable measurements of the system; either solving (e.g., if the system is modeled by a set of equations) or simulating (e.g., if the system is a network, such as an electrical circuit) the system to determine values of the measurements; expressing the gradients of the merit function as the gradient of a weighted sum of measurements; forming an appropriately configured adjoint system; and either solving (e.g., set of equations) or simulating (e.g., network) the adjoint system to simultaneously determine the gradients of the merit function with respect to the at least one parameter by employing a single adjoint analysis. The system may be modeled by a set of equations comprising one or more of the following: a nonlinear set of equations, a linear set of equations, a set of linear partial differential equations, a set of nonlinear partial differential equations, a set of linear differential algebraic equations or a set of nonlinear differential algebraic equations. Preferably, the system of interest may be a network, such as an electrical circuit. In such a case, elements of the adjoint network and excitations of the adjoint network are determined in order to obtain the gradients of the merit function by employing a single adjoint analysis. It is to be appreciated that, in a preferred embodiment, the gradients of the merit function are computed for the purpose of optimization and the merit function is either a Lagrangian merit function or an augmented Lagrangian merit function.

While, certain preferred implementations are mentioned above and described herein, it is to be understood that the teachings of the invention may be implemented in hardware, software or a combination thereof. Also, the system may take one of the forms described above (e.g., set of equations, network) or the system may take any form for which gradient computation is desired. Further, while a preferred purpose for performing gradient computation in accordance with the invention is for system optimization, as summarized below, such methods of gradient computation may be utilized to substantially satisfy any purposes to which they may apply. Still further, while the merit function may preferably be of the Lagrangian or augmented Lagrangian type, any type of merit function may be employed in accordance with the inventive teachings described herein.

Accordingly, in a more specific aspect of the present invention, a method of efficient computation of gradients of a merit function of a system for the purpose of system optimization includes the steps of: specifying at least one optimization parameter (but, preferably, many optimization parameters) associated with an optimization problem; providing a formal statement of the optimization problem as an objective function in terms of observable system measurements; formulating the merit function corresponding to the optimization problem, in terms of the measurements; either solving or simulating the system to determine values of the measurements; forming an appropriately configured adjoint system; either solving or simulating the adjoint system to simultaneously determine the gradients of the merit function with respect to the at least one optimization parameter by employing a single adjoint analysis; and using the measurement and gradient values to iteratively improve the system. Again, the system may preferably be a network, for example, an electrical circuit whereby the purpose of determining the gradients of the merit function is for circuit optimization. In addition, the optimization problem may comprise at least one objective function or at least one constraint; however, the invention is applicable to any number of objective functions in combination with any number of constraints.

It is to be appreciated that due to the fact that the present invention provides for efficient gradient computation by simultaneously computing the gradients of the merit function with respect to all parameters by employing a single adjoint analysis, the computational complexity (including the computational resources to perform the calculations, as well as the computational run time) is substantially reduced, thereby overcoming the disadvantages associated with prior art gradient computation procedures.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
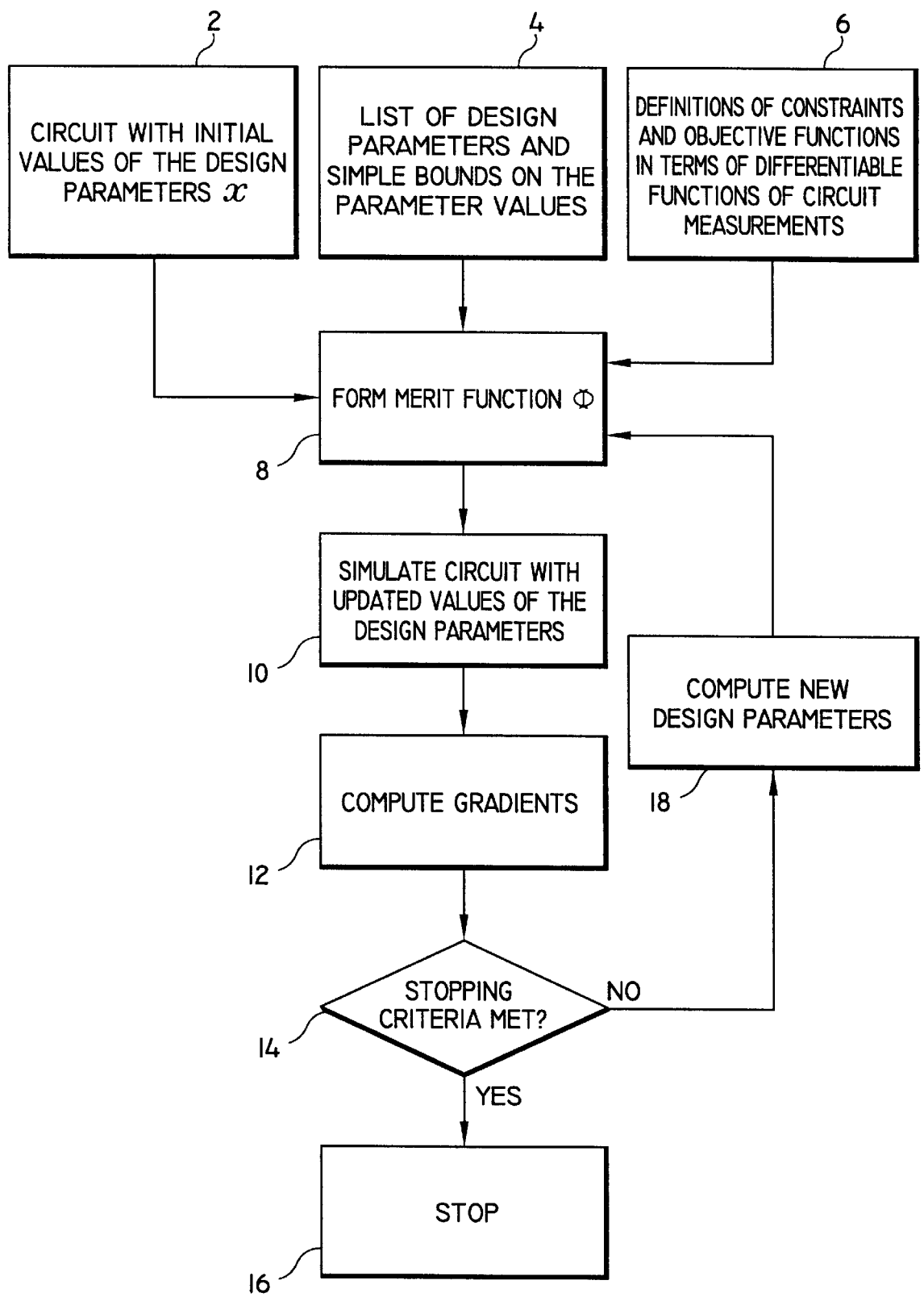
FIG. 1 is a flow chart illustrating a generalized method of circuit optimization.

Referring initially to FIG. 1, a generalized method of gradient-based circuit optimization is shown in flow chart form. It is to be appreciated that such a generalized method of gradient-based circuit-optimization may be implemented on an appropriately programmed general purpose computer.

Also, an optimizer capable of performing such method of circuit optimization may be implemented in hardware, software, or a combination thereof. Thus, given the inputs shown in blocks 2, 4 and 6, circuit optimization may be performed. First, a circuit with initial values of the design parameters associated with the circuit is provided (block 2). The design parameters may be represented as $x_i$, where i=1,2, ... n. Design parameters are the values that are adjusted during optimization, e.g., transistor widths, resistance values, capacitance values, etc. Further, a list of design parameters and simple bounds (including possibly $-\infty$ and/or $+\infty$) on the values that each parameter is allowed to take are provided (block 4). For example, the lower bound on a transistor width may be determined by the technology limit to be 1 micrometer, below which the device ceases to function as a transistor. Lastly, definitions of the constraints and objectives of the optimization problem in terms of differentiable functions of circuit measurements are provided (block 6). Circuit measurements are observable responses of the circuit, e.g., delays, slews, power dissipation, area, etc. The objective function(s) and constraints of the optimization problem are expressed in terms of measurements. For example, the optimization problem may be to minimize the difference between two delays while satisfying constraints on slews, total area and power dissipation.

Given the above inputs, the following steps may be carried out in order to optimize the subject circuit. First a merit function $\Phi$ is formed (block 8). A merit function is an internal function computed by the optimizer to evaluate the "goodness" (i.e., merit) of a solution. In nonlinear optimizers, general constraints are often accommodated by constructing and finding a stationary point of a Lagrangian merit function as disclosed in the text by J. L. Lagrange, "Oeuvres de Lagrange," vols. XI and XIII, Gauthier-Villars, Paris, 1888–1889, or an augmented Lagrangian merit function as disclosed in the article by M. R. Hestenes, "Multiplier and Gradient Methods," Journal of Optimization Theory and Applications, pp. 303–320, vol. 4, (1969) and in the chapter by M. J. D. Powell, "A Method for Nonlinear Constraints in Minimization Problems," in Optimization, R. Fletcher (ed.), Academic Press, London and New York (1969). However, as will be explained, the methods of this invention can be applied to these and other merit functions as well.

The next step is to simulate the circuit to determine the values of all the measurements, and hence the constraint and objective function values (block 10). Typically this computation is achieved by running a circuit simulator. Next, the gradients of the merit function $\Phi$ are computed with respect to the design parameters e.g., $\partial \Phi/\partial x_i$, i=1,2, ... ,n (e.g., block 12). As previously mentioned, prior art methods for computing the gradients of the merit function typically involve individually calculating the gradients of each measurement with respect to each design parameter. However, as will be explained, the gradient computation approach performed by the present invention involves simultaneously computing the gradients of the composite merit function with respect to all the design parameters, which advantageously provides substantial improvement over the prior art gradient computation methods.

If the stopping criteria are met (block 14) then the procedure is stopped (block 16). For a problem without constraints, the stopping criterion is that the gradient of the objective function be zero (or in practice, sufficiently small). The corresponding criterion for a problem with equality constraints is that the constraints be satisfied and that the projection of the objective function gradients on to the constraint manifold be sufficiently small (i.e., approximately zero). However, it is to be understood that, depending on the application, the stopping criteria may also be that the gradient of the objective function (or projection thereof) is less than a predetermined constant. If the criteria are not met (block 14), based on the function and gradient values, compute new design parameters (block 18) that are expected to improve the merit function, and return to block 8 and repeat the steps of the process therefrom.

As previously mentioned, the computation of the gradients (block 12) as performed in accordance with prior art techniques is typically the portion of a circuit optimization procedure which substantially dominates the computing resources and/or computing time of a system performing the optimizing procedure. Such is the case because existing methods of gradient computation involve computing (at each iteration) the gradient of each circuit measurement with respect to each design variable (parameter). Thus, it is evident that such conventional gradient computation approaches are typically the bottleneck in the optimization of larger circuits.

It is to be understood that while the present invention substantially focuses on improved gradient computation, as will be explained in detail, the present invention encompasses a complete gradient-based circuit optimization procedure which utilizes the improved gradient computation approach, described herein, in order to provide efficient circuit optimization.

The remainder of the detailed description is structured in the following manner. A preferred method of the present invention for performing gradient computation is first demonstrated by means of an example. A particular circuit, a specific optimization problem and a Lagrangian merit function are assumed in the example. Then, the concepts taught by the present invention are extended to any circuit and any optimization problem, but with an augmented Lagrangian merit function. Thereafter, the present invention is extended to any general merit function as well.

Figure 2A:
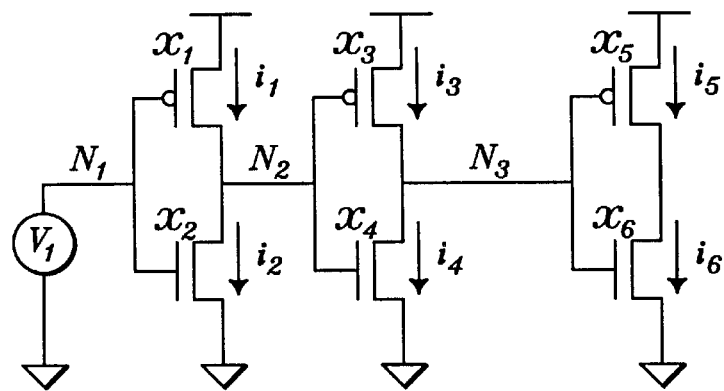
FIGS. 2A through 2C are, respectively, schematic diagrams of a nominal circuit and an adjoint circuit used for sensitivity calculation, and signal waveforms associated with the circuits.

The following is an example used to demonstrate the teachings of the present invention. FIG. 2A shows a nominal circuit consisting of three CMOS inverters driven by a voltage source $V_1$. The input waveform of $V_1$ is shown in FIG. 2C (labeled as $N_1$) along with the voltage waveform on the internal node $N_3$ (labeled as $N_3$). The measurements $t_1$ and $t_2$ (FIG. 2C) are the 50% crossing points of the voltage on node $N_3$. Assume that the optimization problem is as follows:

$$\text{minimize } t_1 \qquad (1)$$

subject to $t_2=T$, where T is a constant target time. Assume that the variables of the problem are the widths of the six transistors $x_i$, i=1, 2, ... , 6, and an initial value and simple bounds on each variable are specified. Further assume that in order to solve the problem, a Lagrangian merit function $\Phi$ is formed as follows:

$$\Phi = t_1 + \lambda(t_2 - T), \qquad (2)$$

where $\lambda$ is the Lagrange multiplier or dual variable. In order to minimize $\Phi$, we must compute the gradients of $\Phi$, i.e., $\partial \Phi/\partial x_i$, i=1, 2, ... , 6, as explained above in block 12 (FIG. 1).

It is to be appreciated that, in accordance with adjoint circuit analysis, the following procedure is performed. First, the nominal circuit is simulated and the necessary waveforms are stored. The simulation may be carried out by employing a circuit simulator. A conventional incremental-in-time simulator like SPICE (Simulation Program with Integrated Circuit Emphasis) as disclosed in the article by L. W. Nagel, SPICE2: A Computer Program to Simulate Semiconductor Circuits, Memo UCB/ERL M520, University of California, Berkeley, (May 1975), or a piecewise approximate simulator such as SPECS (Simulation Program for Electronic Circuits and Systems), as disclosed in the article by C. Visweswariah et al., "Piecewise Approximate Circuit Simulation," IEEE Transactions on Computer-Aided Design of Integrated Circuits and Systems, pp. 861–870, vol. CAD-10 (July 1991), may be used. These simulators formulate and solve the nonlinear algebraic differential equations associated with the circuit. The present invention preferably performs circuit simulation by employing the SPECS circuit simulator. It is to be understood that SPECS is a simulator that models electronic devices by piecewise approximate functions. The simplification of the device models, along with an event-driven simulation algorithm, causes such a class of simulators to be much faster than simulators such as SPICE.

Figure 2B:
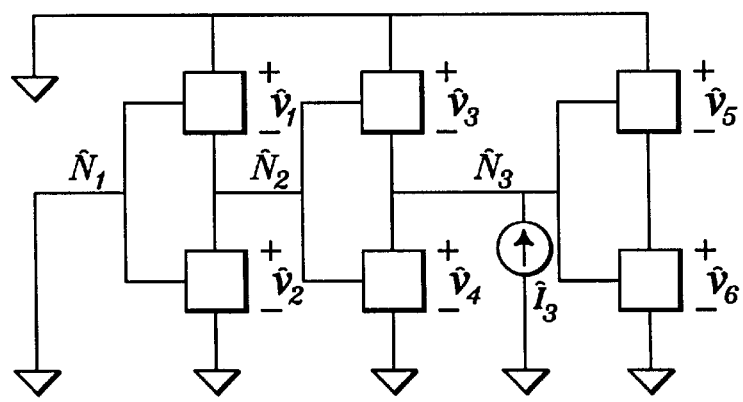
Figure 2C:
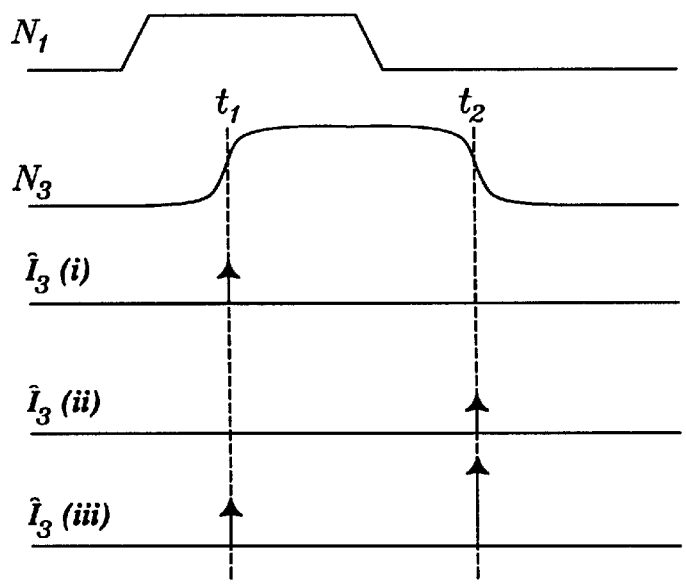

Next, the adjoint circuit may be constructed as shown in FIG. 2B. The adjoint circuit is topologically identical to the nominal circuit, but the branch characteristics of the devices are chosen so that the solution of the circuit yields the necessary sensitivities (i.e., gradients). For example, as shown in FIG. 2B, independent voltage sources are shorted in this example (i.e., the input signal and power supply have been grounded). Adjoint circuit quantities are denoted with a carat symbol, ^, placed over the quantity (e.g., $N_1$ in the nominal circuit corresponds to $\hat{N}_1$ in the adjoint circuit).

To compute $\partial t_1/\partial x_i$, the adjoint circuit is driven by a current source at node $N_3$ (the measurement point in the circuit) with a unit Dirac impulse at time $t_1$, as shown by waveform $\hat{I}_3(i)$ in FIG. 2C. Then the adjoint circuit is solved while running time backwards from time $t_{max}$ to 0 where $t_{max}$ is the simulation interval of the nominal circuit. The required sensitivities, $\partial t_1/\partial x_i$, are proportional to the convolution integrals:

$$\int_0^{t_{max}} \hat{v}_i(\tau) i_i(t_{max} - \tau) d\tau, i = 1,2,\ldots,6$$

where the current waveforms $i_i(t)$ are taken from the nominal circuit (FIG. 2A) and the $\hat{v}_i(\tau)$ are the adjoint circuit (FIG. 2B) branch voltages. Piecewise approximate simulators lend themselves well to the application of Dirac impulse stimuli and efficient computation of convolution integrals. Now, to compute $\partial t_2/\partial x_1$, the prior art gradient computation method teaches that the above procedure is repeated, but with a unit Dirac impulse at $t_2$ in $I_3$, as shown by waveform $\hat{I}_3(ii)$ in FIG. 2C. The adjoint circuit is solved and convolutions carried out as explained above.

Finally, the required gradients are assembled from the results yielded by the above-described computations of $\partial t_1/\partial x_i$ and $\partial t_2/\partial x_i$, and are represented as follows:

$$\frac{\partial \Phi}{\partial x_i} = \frac{\partial}{\partial x_i} [t_1 + \lambda(t_2 - T)] = \frac{\partial t_1}{x_i} + \lambda \frac{\partial t_2}{\partial x_i}, \quad i = 1,2,\ldots,6. \quad (3)$$

Thus, two solutions in this example (or as many solutions as the number of measurements in general) of the adjoint circuit are needed. During the computation of each solution, a convolution integral must be computed for each design parameter.

However, in accordance with the present invention, it is advantageously recognized that equation (3) may be represented as follows:

$$\frac{\partial \Phi}{\partial x_i} = \frac{\partial}{\partial x_i} [t_1 + \lambda t_2], i = 1,2,\ldots,6, \quad (4)$$

whereby equation (4) represents the sensitivity of a scalar combination of measurements. Since the merit function can be expressed as a scalar function, the present invention teaches that the sensitivity (i.e., gradient) of the merit function can be found by a single adjoint analysis, that is, the gradients with respect to all design parameters may be simultaneously calculated by a single adjoint analysis. In this particular example, $\hat{I}_3$ is constructed to have two Dirac impulses at times corresponding to $t_1$ and $t_2$, and the heights of these impulses are proportional to the coefficients of $t_1$ and $t_2$, in equation (4), as shown in FIG. 2C by waveform $\hat{I}_3(iii)$. Thus, the excitation of the adjoint circuit depends on optimization variable(s) which, in this particular example for $t_2$, is $\lambda$ (i.e., the Lagrange multiplier or dual variable). The adjoint circuit is solved and the convolution integrals carried out as explained above to yield the required sensitivities (i.e., gradients). Thus, in accordance with the present invention as applied to this example, a single solution of the adjoint circuit and a single set of convolution integrals can be used to replace the two solutions and two sets of convolution integrals required in the prior art methods. Advantageously, the teachings of the present invention may be extended to any circuit, any number of measurements, any optimization problem and any merit function, as will be explained.

The more general formulation for the case where the merit function $\Phi$ is a Lagrangian or augmented Lagrangian is presented below. It is to be appreciated that the present invention is applicable, however, to any differentiable merit function as will be explained following this formulation utilizing an augmented Lagrangian merit function. Assume that design parameters are $x_i$, $i=1,2,\ldots,n$ and the circuit measurements of interest are $m_j(x)$, $j=1,2\ldots p$. Further, assume that the optimization problem is stated as minimize $f(m)$ (5)

subject to $c_k(m)=0$, $k=1,2\ldots,q$, where the objective function is a differential function of the measurements $f(m)$ and the constraints are differentiable functions of the measurements $c_k(m)$. The above problem statement is general enough to express a maximization problem, or an objective function that is a differentiable function (or in particular, the weighted sum) of many measurements, or inequality constraints that have been recast as equalities by the addition of slack variables, or nonlinear sum-of-squares problems. Further, a straightforward Lagrangian merit function may be represented as:

$$\Phi = f(m) + \sum_{k=1}^{q} \lambda_k c_k(m) \quad (6)$$

where the $\lambda_k$ represent the Lagrange multipliers or dual variables. Still further, an augmented Lagrangian merit function with a quadratic penalty term may be represented as:

$$\Phi = f(m) + \sum_{k=1}^{q} \lambda_k c_k(m) + \frac{1}{2\mu} \sum_{k=1}^{q} c_k^2(m) \quad (7)$$

where $\mu$ is a penalty parameter that weights feasibility. The following example considers only the augmented Lagrangian equation (7), since the Lagrangian form of equation (6) is merely a special case thereof. Once the circuit has been evaluated at any particular iteration, all the function values are known. Then, the gradients may be represented as:

$$\frac{\partial \Phi}{\partial x_i} = \sum_{j=1}^{p} \frac{\partial f}{\partial m_j} \frac{\partial m_j}{\partial x_i} + \sum_{k=1}^{q} \lambda_k \left( \sum_{j=1}^{p} \frac{\partial c_k}{\partial m_j} \frac{\partial m_j}{\partial x_i} \right) + \frac{1}{\mu} \sum_{k=1}^{q} \left( \sum_{j=1}^{p} \frac{\partial c_k}{\partial m_j} \frac{\partial m_j}{\partial x_i} \right) c_k, \ i = 1,2,\ldots,n \quad (8)$$

which can be rewritten as:

$$\frac{\partial \Phi}{\partial x_i} = \sum_{j=1}^{p} \frac{\partial m_j}{\partial x_i} \left[ \frac{\partial f}{\partial m_j} + \sum_{k=1}^{q} \left( \lambda_k + \frac{c_k}{\mu} \right) \frac{\partial c_k}{\partial m_j} \right], \quad (9)$$

$$i = 1,2,\ldots,n$$

$$= \sum_{j=1}^{p} w_j \frac{\partial m_j}{\partial x_i}, \ i = 1,2,\ldots,n$$

$$= \frac{\partial}{\partial x_i} \sum_{j=1}^{p} w_j m_j, \ i = 1,2,\ldots,n$$

where the $w_j$ represent constant weight factors. Once the nominal circuit has been simulated or solved, the coefficients of $m_j/\partial x_i$ are known and can therefore be treated as constant weight factors $w_j$ for the purposes of gradient computation in accordance with the invention. These co-efficient include $\lambda_k$, $f$, $c_k$, $\mu$, $\partial c_k/\partial m_j$, and $\partial f/\partial m_j$. Hence, the required gradients can be expressed as the gradient of a scalar weighted sum of measurements and, therefore, the gradients of the merit function with respect to all design parameters can be computed by means of a single adjoint analysis. In this adjoint analysis, the excitations of the adjoint circuit are chosen appropriately and scaled to incorporate the weights $w_j$ so that the sensitivity function of interest is in effect the composite merit function. It is to be appreciated that the above procedure preferably requires substantially close communication between the portion of the nonlinear optimizer which decides and updates values such as the Lagrange multipliers and penalty parameter and the simulation and gradient computation portion which controls the excitations that are applied to the adjoint circuit.

As previously mentioned, the following portion of the detailed description describes the extension of the teachings of the present invention to general merit functions. As above, let the circuit measurements of interest be $m_j(x)$, $j=1,2,\ldots,p$ and let the optimization problem be as follows:

minimize $f(m)$ subject to $c_k(m)=0, k=1,2\ldots,q,$ where the objective function is a differentiable function of the measurements $f(m(x))$ and the constraints are differentiable functions of the measurements $c_k(m(x))$, $k=1,2,\ldots,q$. Let the merit function be any differentiable function of the constraints and objective function(s) $\Phi=g(f\ c_1, c_2, \ldots, c_q$. Then, the computation of the gradient $\partial \Phi/\partial x$ may be represented as follows:

$$\frac{\partial \Phi}{\partial x_i} = \frac{\partial g}{\partial f} \frac{\partial f}{\partial x_i} + \sum_{k=1}^{q} \frac{\partial g}{\partial c_k} \frac{\partial c_k}{\partial x_i}, \ i = 1,2,\ldots,n \quad (11)$$

$$= \frac{\partial g}{\partial f} \left( \sum_{j=1}^{p} \frac{\partial f}{\partial m_j} \frac{\partial m_j}{\partial x_i} \right) +$$

$$\sum_{k=1}^{q} \frac{\partial g}{\partial c_k} \left( \sum_{j=1}^{p} \frac{\partial c_k}{\partial m_j} \frac{\partial m_j}{\partial x_i} \right),$$

$$i = 1,2,\ldots,n$$

$$= \sum_{j=1}^{p} w_j \frac{\partial m_j}{\partial x_i}, \ i = 1,2,\ldots,n$$

$$= \frac{\partial}{\partial x_i} \left( \sum_{j=1}^{p} w_j m_j \right), \ 1,2,\ldots,n.$$

Again, note that once the nominal circuit has been simulated or solved, the coefficients of the $\partial m_j/\partial x_i$ terms are known and can therefore be treated as constant weight factors $w_j$ for the purposes of gradient computation. It is to be understood that the prior art method of computing the right hand side of equation (11) would be accomplished in one of the following ways. In using the conventional direct method of computing circuit gradients, the $\partial m_j/\partial x_i$ terms for all values of j and one particular value of i can be computed at once by a single analysis of the associated sensitivity circuit, as disclosed in the D. A. Hocevar et al. article previously mentioned. However, disadvantageously, n solutions of the associated sensitivity circuit are required to determine $\partial m_j/\partial x_i$ terms for all values of j and all values of i. Finally, the summations on the right hand side of equation (11) are assembled. On the other hand, in using the prior art adjoint method of computing circuit gradients, all $\partial m_j/\partial x_i$ terms for all values of i and one particular value of j can be computed at once by a single analysis of the associated adjoint circuit, as disclosed in the S. W. Director et al. article previously mentioned. However, disadvantageously, p solutions of the associated adjoint circuit are required to determine the $\partial m_j/\partial x_i$ terms for all values of j and all values of i. If time-domain gradient computation is necessary because the measurements are in the time-domain, then a total of n×p convolution integrals must be computed. Finally, the summations on the right hand side of equation (11) are assembled.

However, in accordance with the present invention, equation (11) is recognized to be the derivative of a scalar function of circuit measurements and, hence, the gradient of such a scalar function may advantageously be computed with respect to all design parameters at once, using a single adjoint analysis. Thus, instead of computing the $\partial m_j/\partial x_i$ terms individually as done in the prior art, the present invention provides for directly computing $\partial \Phi/\partial x_i$ for all values of i simultaneously by means of a single analysis of the associated adjoint circuit. Accordingly, only n convolution integrals are necessary for time-domain gradient computation. In addition, no assembly of gradient values is required. To first order, the computational speedup achieved over the traditional direct method is a factor of n and the computational speedup achieved over the traditional adjoint method is a factor of p. Thus, in accordance with the present invention, all the required gradients of the merit function with respect to all the design parameters may be computed by means of a single adjoint analysis.

It is also to be appreciated that while equations (6) and (7) illustrate merit functions built for the purposes of a particular kind of optimization, the present invention is applicable to find the gradients of any scalar function of measurements or responses (constructed for any type of optimization or other purpose) of any physical system or system of equations or differential equations.

Furthermore, it is to be appreciated that the circuit optimization method of the present invention may find many and varied practical applications. For instance, such a novel circuit optimization procedure may be employed in all computer-aided design (CAD) programs substantially targeted at circuit optimization. Also, the teachings of the present invention are also applicable to gradient-based optimization of any system (e.g., linear or nonlinear, static or dynamic) in which the optimization merit function is a differentiable function of system measurements, and in which the gradients of such measurements, with respect to controllable variables, are amenable to being computed by an adjoint analysis. Further, the present invention may be employed to determine the gradients of any scalar function of measurements or responses of any nonlinear system or any system of nonlinear differential equations. Still further, the methods for computing gradients taught in accordance with the present invention may be used for substantially any applicable purpose which may be contemplated by one of ordinary skill in the art and, therefore, it is to be understood that gradient-based optimization is merely one example of such applications.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A computer program device readable by a machine, tangibly embodying a program of instructions executable by the machine to perform method steps for efficiently computing gradients of a merit function of a system, the method comprising the steps of:
   a) inputting a least one parameter for which the gradients with respect to the at least one parameter are desired;
   b) computing the merit function of interest in terms of observable measurements of the system;
   c) one of solving and simulating the system to determine values of the measurements;
   d) expressing the gradients of the merit function as the gradient of a weighted sum of measurements;
   e) forming an appropriately configured adjoint system;
   f) one of solving and simulating the adjoint system to simultaneously determine the gradients of the merit function with respect to the at least one parameter by employing a single adjoint analysis; and
   g) optimizing said system by utilizing said gradients of the merit function.

2. The method of claim 1, wherein the system is modeled by a set of equations comprising of at least one of a nonlinear set of equations, a linear set of equations, a set of linear partial differential equations, a set of nonlinear partial differential equations, a set of linear differential algebraic equations and a set of nonlinear differential algebraic equations.

3. The method of claim 1, wherein the system of interest is a network.

4. The method of claim 3, wherein elements of the adjoint network and excitations of the adjoint network are determined in order to obtain the gradients of the merit function by employing a single adjoint analysis.

5. The method of claim 3, wherein the network is an electrical circuit.

6. The method of claim 1, wherein the gradients of the merit function are computed for the purpose of optimization.

7. A computer program device readable by a machine, tangibly embodying a program of instructions executable by the machine to perform method steps for efficiently computing gradients of a merit function of a system, the method comprising the steps of:
   a) inputting at least one parameter for which the gradients with respect to the at least one parameter are desired;
   b) providing a formal statement of the optimization problem as at least one objective function in terms of observable system measurements;
   c) formulating the merit function corresponding to the optimization problem, in terms of the measurements;
   d) one of solving and simulating the system to determine values of the measurements;
   e) forming an appropriately configured adjoint system;
   f) one of solving and simulating the adjoint system to simultaneously determine the gradients of the merit function with respect to the at least one parameter by employing a single adjoint analysis; and
   g) optimizing said system by utilizing said gradients of the merit function.

8. The method of claim 7, wherein optimization is carried out until optimal design parameters are computed as judged by the gradient of the objective function being smaller than a predetermined constant.

9. The method of claim 7, wherein the optimization problem includes one of at least one objective function and at least one constraint.

10. The method of claim 9, wherein optimization is carried out until optimal design parameters are computed as judged by a projection of the at least one objective function gradients on a manifold of the at least one constraint being smaller than a predetermined constant.

11. The method of claim 7 further comprising:
   a) formulating the merit function;
   b) determining the measurement values and gradients of the merit function;
   c) computing at least one new design parameter in order to improve the merit function;
   d) iteratively improving the performance of the system; and
   e) judging optimality.

12. The method of claim 11, wherein said method is applied to one of single criterion and multi-criteria optimization.

13. The method of claim 7, wherein the merit function is one of a Lagrangian and an augmented Lagrangian merit function.

14. Computer based apparatus for efficient computation of gradients of a merit function of a system, the apparatus comprising:
   means for specifying at least one parameter for which the gradients with respect to the at least one parameter are desired;
   means for specifying the merit function of interest in terms of observable measurements of the system;
   means for one of solving and simulating the system to determine values of the measurements;
   means for storing a plurality of waveforms when simulating said system;

means for expressing the gradients of the merit function as the gradient of a weighted sum of measurements;

means for forming an appropriately configured adjoint system;

means for solving and simulating the adjoint system to simultaneously determine the gradients of the merit function with respect to the at least one parameter by employing a single adjoint analysis; and means for using said gradient values for optimizing the system.

15. The apparatus of claim 14, wherein the system is modeled by a set of equations comprising of at least one of a nonlinear set of equations, a linear set of equations, a set of linear partial differential equations, a set of nonlinear partial differential equations, a set of linear differential algebraic equations and a set of nonlinear differential algebraic equations.

16. The apparatus of claim 14, wherein the system of interest is a network.

17. The apparatus of claim 16, wherein elements of the adjoint network and excitations of the adjoint network are determined in order to obtain the gradients of the merit function by employing a single adjoint analysis.

18. The apparatus of claim 16, wherein the network is an electrical circuit.

19. The apparatus of claim 14, wherein the gradients of the merit function are computed for the purpose of optimization.

20. Computer based apparatus for efficient computation of gradients of a merit function of a system, the apparatus comprising:

a) means for specifying at least one optimization parameter associated with an optimization problem;

b) means for providing a formal statement of the optimization problem as at least one objective function in terms of observable system measurements;

c) means for formulating the merit function corresponding to the optimization problem, in terms of the measurements;

d) means for one of solving and simulating the system to determine values of the measurements;

e) means for forming an appropriately configured adjoint system;

f) means for one of solving and simulating the adjoint system to simultaneously determine the gradients of the merit function with respect to the at least one optimization parameter by employing a single adjoint analysis; and g) means for using said gradient values for optimizing the system.

* * * * *

UNITED STATES PATENT AND TRADEMARK OFFICE
CERTIFICATE OF CORRECTION

PATENT NO. : 5,886,908
DATED : March 23, 1999
INVENTOR(S) : Andrew R. Conn,

It is certified that error appears in the above-identified patent and that said Letters Patent is hereby corrected as shown below:

On the title page item [75], line 2, "Manor" should read --Cortlandt Manor--.

Column 6, line 45, "differential" should read --differentiable--.

Column 7, line 29, "$m_j/\partial x_i$," should read --$\partial m_j/\partial x_i$--.

Column 7, line 31, "These co-efficient" should read --These co-efficients--.

Column 7, line 65, "$c_q$." should read --$c_q$).--.

Signed and Sealed this

Fourteenth Day of September, 1999

Attest:

Q. TODD DICKINSON

*Attesting Officer*    *Acting Commissioner of Patents and Trademarks*